United States Patent
Chen

(10) Patent No.: US 8,436,448 B2
(45) Date of Patent: May 7, 2013

(54) THROUGH-SILICON VIA WITH AIR GAP

(75) Inventor: Ming-Fa Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 39 days.

(21) Appl. No.: 13/028,655

(22) Filed: Feb. 16, 2011

(65) Prior Publication Data

US 2011/0133335 A1    Jun. 9, 2011

Related U.S. Application Data

(62) Division of application No. 12/347,745, filed on Dec. 31, 2008, now Pat. No. 7,910,473.

(51) Int. Cl.
*H01L 23/48* (2006.01)

(52) U.S. Cl.
USPC ............ 257/621; 257/E23.013; 257/E23.067

(58) Field of Classification Search .................... 438/667
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,880,018 A | 3/1999 | Boeck et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |

(Continued)

FOREIGN PATENT DOCUMENTS

| | | |
|---|---|---|
| CN | 1191384 A | 8/1998 |
| JP | 2007-012854 A | 1/2007 |

*Primary Examiner* — Stephen W Smoot

(74) *Attorney, Agent, or Firm* — Slater & Matsil, L.L.P.

(57) ABSTRACT

A semiconductor substrate having a through-silicon via with an air gap interposed between the through-silicon via and the semiconductor substrate is provided. An opening is formed partially through the semiconductor substrate. The opening is first lined with a liner and then the opening is filled with a conductive material. A backside of the semiconductor substrate is thinned to expose the liner, which is subsequently removed to form an air gap around the conductive material of the through-silicon via. A dielectric layer is formed of the backside of the semiconductor substrate to seal the air gap.

20 Claims, 5 Drawing Sheets

U.S. PATENT DOCUMENTS

| | | |
|---|---|---|
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,843,068 B2 | 11/2010 | Murayama et al. |
| 7,910,473 B2 | 3/2011 | Chen |
| 2001/0028105 A1 | 10/2001 | Hashimoto et al. |
| 2006/0264041 A1 | 11/2006 | Rigg et al. |
| 2007/0045836 A1 | 3/2007 | Kwon et al. |
| 2007/0069327 A1 | 3/2007 | Tegen et al. |
| 2007/0085189 A1 | 4/2007 | Sunohara et al. |
| 2007/0222054 A1 | 9/2007 | Hembree |
| 2008/0136038 A1 | 6/2008 | Savastiouk et al. |
| 2008/0138975 A1 | 6/2008 | Pratt et al. |
| 2009/0085164 A1 | 4/2009 | Murayama et al. |
| 2009/0243047 A1 | 10/2009 | Wolter et al. |
| 2010/0167534 A1 | 7/2010 | Iwata |
| 2010/0176494 A1 | 7/2010 | Chen |

THROUGH-SILICON VIA WITH AIR GAP

This application is a divisional of U.S. patent application Ser. No. 12/347,745, now U.S. Pat. No. 7,910,473, entitled "Through-Silicon Via with Air Gap," filed on Dec. 31, 2008, which application is incorporated herein by reference.

TECHNICAL FIELD

This invention relates generally to integrated circuits and, more particularly, to a semiconductor device having through-silicon vias.

BACKGROUND

Since the invention of the integrated circuit (IC), the semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvements in lithography have resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate. This attempt, however, requires a carrier substrate larger than the dies for the wire bonding.

More recent attempts have focused on through-silicon vias (TSVs). Generally, a TSV is formed by etching a vertical via through a substrate and filling the via with a conductive material, such as copper. A dielectric liner, typically tetraethyl ortho-silicate (TEOS), is formed along the sidewalls of the via prior to filling the via with the conductive material. The dielectric constant of TEOS, however, is about 4.2, thereby creating a potentially large capacitance. This large capacitance may in turn adversely affect the performance of a resistor-capacitor (RC) circuit.

Accordingly, there is a need for a better structure of and method of forming TSV structures.

SUMMARY OF THE INVENTION

These and other problems are generally reduced, solved or circumvented, and technical advantages are generally achieved, by embodiments of the present invention, which provides through-silicon vias for a semiconductor device.

In accordance with an embodiment of the present invention, a semiconductor device is provided. The semiconductor device includes a semiconductor substrate having a through-silicon via extending therethrough. An air gap is interposed between the through-silicon via and the semiconductor substrate.

In accordance with another embodiment of the present invention, a method of forming a semiconductor device is provided. A semiconductor substrate having a first side and a second side opposite the first side is provided. An opening is formed in the semiconductor device, and a first dielectric layer is formed along sidewalls of the opening. Thereafter, a conductive material is formed in the opening over the first dielectric layer. The second side of the semiconductor substrate is thinned to expose the first dielectric layer, which is then removed. After removing the first dielectric layer, a second dielectric layer is formed on the second side of the semiconductor substrate to seal an air gap in the opening.

In accordance with yet another embodiment of the present invention, another method of forming a semiconductor device is provided. The method includes providing a semiconductor substrate having a through-silicon via extending from a circuit side partially through the semiconductor substrate, wherein a liner is interposed between the through-silicon via and the semiconductor substrate. A backside of the semiconductor substrate is thinned such that the liner is exposed, and at least a portion of the liner is exposed. At least a portion of the liner is interposed between the through-silicon via and the semiconductor substrate, forming an opening around the through-silicon via on the backside of the semiconductor substrate. A dielectric layer is formed over the opening, leaving a sealed air gap interposed between the through-silicon via and the semiconductor substrate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
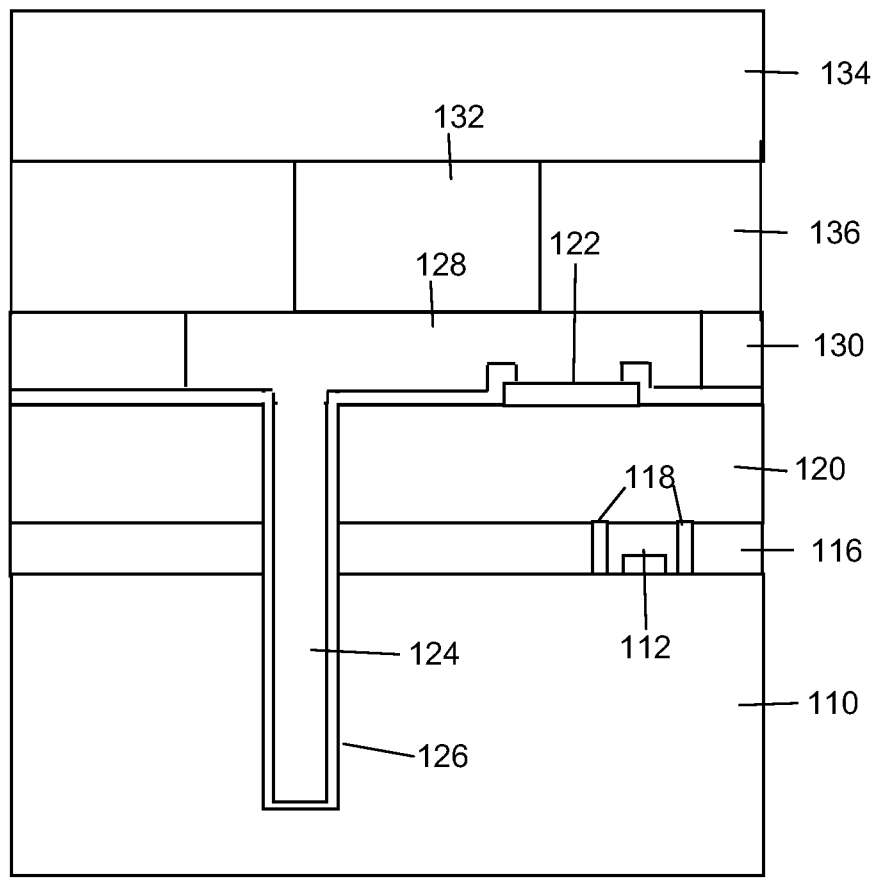
FIGS. 1-5 illustrate intermediate stages in forming a semiconductor device that may be used in accordance with an embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of a method for forming a die having a through-silicon via suitable for use in a three-dimensional integrated circuit (e.g., a stacked die configuration) or a backside bonding configuration are illustrated in FIGS. 1-4. Throughout the various views and illustrative embodiments of the present invention, like reference numerals are used to designate like elements.

Referring first to FIG. 1, a semiconductor substrate 110 having electrical circuitry 112 formed thereon is shown. The semiconductor substrate 110 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The electrical circuitry 112 formed on the semiconductor substrate 110 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the electrical circuitry 112 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1 is an inter-layer dielectric (ILD) layer 116. The ILD layer 116 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the ILD layer 116 may comprise a plurality of dielectric layers.

Contacts 118 are formed through the ILD layer 116 to provide an electrical contact to the electrical circuitry 112. The contacts 118 may be formed, for example, by using photolithography techniques to deposit and pattern a photoresist material on the ILD layer 116 to expose portions of the ILD layer 116 that are to become the contacts 118. An etch process, such as an anisotropic dry etch process, may be used to create openings in the ILD layer 116. The openings are, preferably, lined with a diffusion barrier layer and/or an adhesion layer (not shown), and filled with a conductive material. Preferably, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 118 as illustrated in FIG. 1.

One or more inter-metal dielectric (IMD) layers 120 and the associated metallization layers (not shown) are formed over the ILD layer 116. Generally, the one or more IMD layers 120 and the associated metallization layers are used to interconnect the electrical circuitry to each other and to provide an external electrical connection. The IMD layers 120 are preferably formed of a low-K dielectric material, such as fluorosilicate glass (FSG) formed by PECVD techniques or high-density plasma chemical vapor deposition (HDPCVD) or the like, and may include intermediate etch stop layers. Contacts 122 are provided in the uppermost IMD layer to provide external electrical connections.

It should also be noted that one or more etch stop layers (not shown) may be positioned between adjacent ones of the dielectric layers, e.g., the ILD layer 116 and the IMD layers 120. Generally, the etch stop layers provide a mechanism to stop an etching process when forming vias and/or contacts. The etch stop layers are preferably formed of a dielectric material having a different etch selectivity from adjacent layers, e.g., the underlying semiconductor substrate 110, the overlying ILD layer 116, and the overlying IMD layers 120. In an embodiment, etch stop layers may be formed of SiN, SiCN, SiCO, CN, combinations thereof, or the like, deposited by CVD or PECVD techniques.

Also shown in FIG. 1 is a through-silicon via 124. The through-silicon via 124 may be formed by any appropriate method. For example, openings may be formed extending into the semiconductor substrate 110 by, for example, one or more etching processes, milling, laser techniques, or the like. The openings are preferably lined with a liner, such as a liner 126, that acts as an isolation layer. Preferably, the liner 126 comprises one or more layers of TEOS, but other materials may be used. As will be discussed in greater detail below, portions of the liner 126 will be removed during subsequent processing steps, so a material that is easy to work with and is easy to remove while causing little or no damage to the other structures should be used.

A protective layer 130, such as a polyimide material, may be formed and patterned over the surface of the liner 126. Thereafter, the openings may be filled with a conductive material, such as copper, tungsten, aluminum, silver, and combinations thereof, or the like, thereby forming the through-silicon via 124. Other materials, including conductive diffusion barrier layers, such as TaN, Ta, TiN, Ti, CoW, or the like, may also be used.

Contacts 132, such as metal bumps formed of Cu, W, CuSn, AuSn, InAu, PbSn, or the like, are formed in electrical contact with a conductive line 128, and a carrier substrate 134 is attached using an adhesive 136. Generally, the carrier substrate 134 provides temporary mechanical and structural support during subsequent processing steps. In this manner, damage to the semiconductor substrate 110 is reduced or prevented. The carrier substrate 134 may comprise, for example, glass, silicon oxide, aluminum oxide, and the like. The adhesive 136 may be any suitable adhesive, such as an ultraviolet (UV) glue, which loses its adhesive property when exposed to UV lights.

It should be noted, however, that the material selected for the liner 126 should be selected such that a high-etch selectivity exists between the material used to form the liner 126 and the surrounding materials, e.g., the materials of the semiconductor substrate 110, the through-silicon via 124, and any relevant ILD layer 116, IMD layers 120, and/or etch stop layers. As will be discussed in greater detail below, the liner 126 is removed in subsequent processing steps, and as such, a high-etch rate selectivity allows the removal of the liner 126 with little or no damage to the surrounding layers.

It should also be noted that the through-silicon via 124 is illustrated as extending into the semiconductor substrate 110 from a top surface of the IMD layers 120 for illustrative purposes only and that other arrangements may be utilized. In another embodiment the through-silicon via 124 may extend from a top surface of the ILD layer 116 or the semiconductor substrate 110. For example, in an embodiment, the through-silicon via 124 is formed by creating openings extending into the semiconductor substrate 110 after forming the contacts 118 by, for example, one or more etching processes, milling, laser techniques, or the like. The openings are also preferably lined with a liner, such as liner 126, that acts as an isolation layer, and filled with a conductive material as discussed above. The IMD layers 120 may then be formed over the through-silicon via and, optionally, external electrical connections may be created to the through-silicon via using the metallization layers.

The through-silicon via 124 is also illustrated as extending over a top dielectric surface, e.g., the IMD layer 120 for illustrative purposes. In this embodiment, the through-silicon via 124 may be formed of a single conductive layer with the conductive line 128, interconnecting the through-silicon via 124 with the contact 122. In other embodiments, the through-silicon via 124 may not be interconnected with electrical circuitry formed on the semiconductor substrate 110. In this embodiment, the through-silicon via provides an electrical connection to electrical circuitry formed on another substrate (not shown) coupled on either the backside of the substrate or the circuit side of the substrate.

Figure 2:
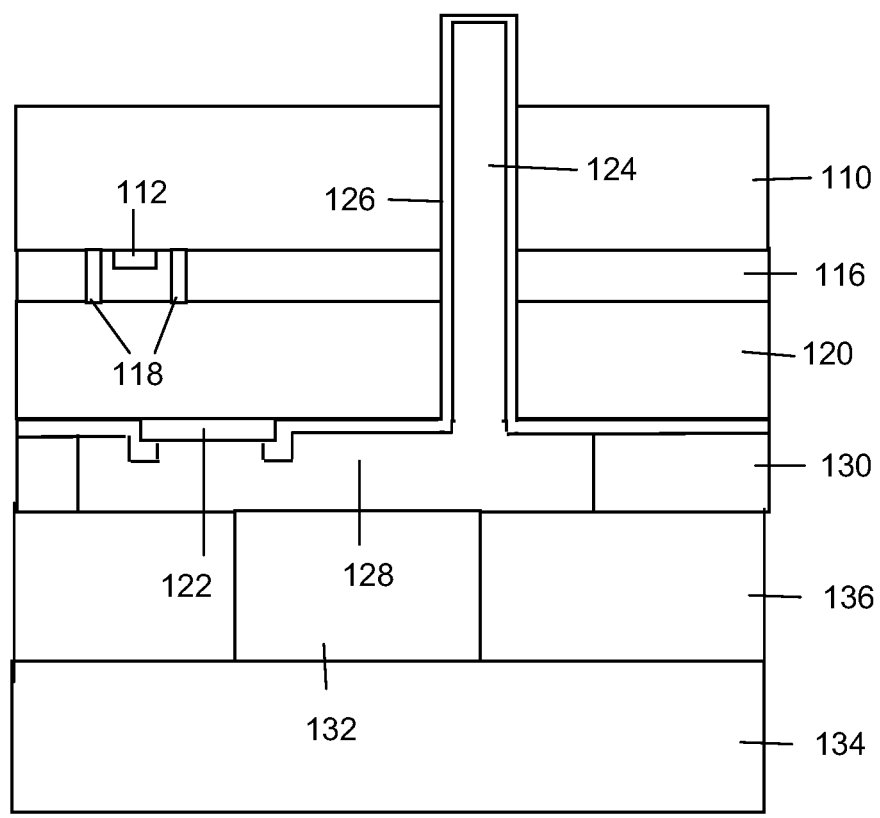

FIG. 2 illustrates a thinning process performed on a backside of the semiconductor substrate 110 to expose the liner 126 in accordance with an embodiment of the present invention. The thinning process may be performed using an etching process and/or a planarization process, such as a mechanical grinding process or a chemical mechanical polishing (CMP) process. For example, initially a planarizing process, such as grinding or a CMP, may be performed to initially expose the liner 126. Thereafter, one or more wet etching processes having a high etch-rate selectivity between the material of the liner 126 and the semiconductor substrate 110 may be performed, thereby leaving the through-silicon via 124 protruding from the backside of the semiconductor substrate 110 as illustrated in FIG. 2. The etch process may be, for example, a dry etch process using $HBr/O_2$, $HBr/Cl_2/O_2$, $SF_6/CL_2$, $SF_6$ plasma, or the like. It should be noted, however, that in other embodiments, the through-silicon via 124 may not protrude from the backside of the semiconductor substrate 110.

Figure 3:
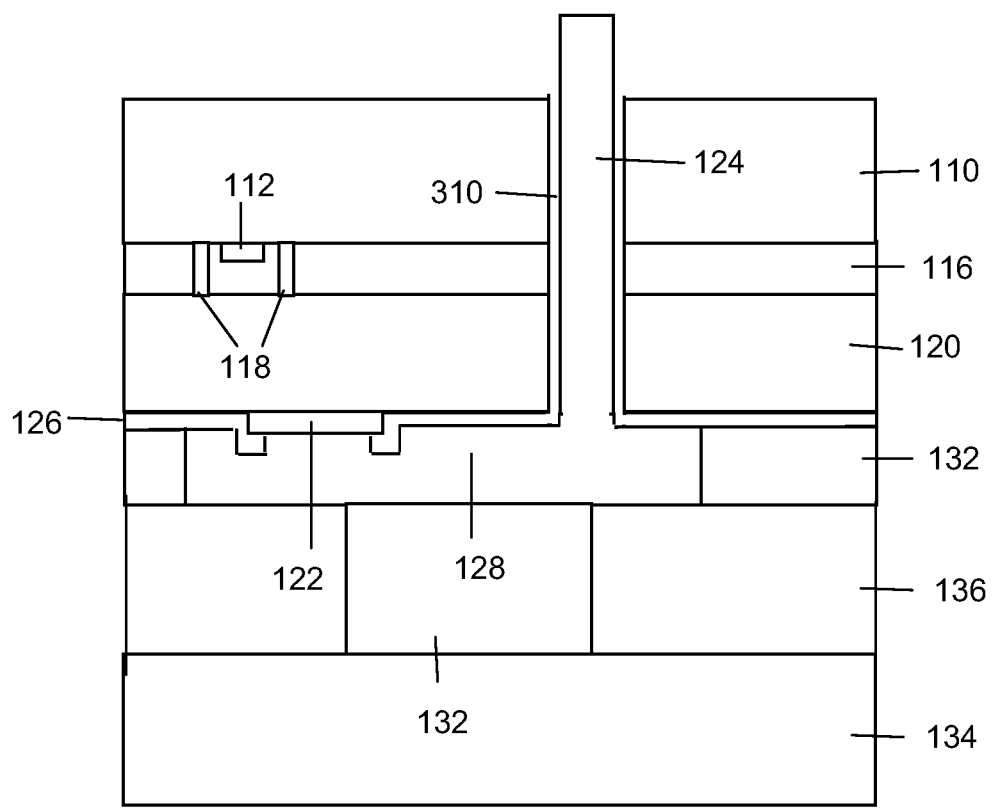

FIG. 3 illustrates an etching process to remove at least a portion of the liner 126 in accordance with an embodiment of the present invention. One or more wet etching processes having a high etch-rate selectivity between the material of the liner 126 and the surrounding materials, e.g., the material of the semiconductor substrate 110, the ILD layer 116, the IMD layers 120, the conductive material of the through-silicon via 124, and/or, if present, etch stop layers may be performed. As a result, an air gap 310 surrounding the through-silicon via 124 is formed. One of ordinary skill in the art will appreciate that the dielectric constant of air (about 1.0) is less than the dielectric constant of the liner 126, e.g., less than the dielectric constant of TEOS. Because the dielectric constant is lower, the capacitance is lowered. In an embodiment in which the liner 126 is formed of TEOS, the liner 126 may be removed by etching, for example, using $XeF_2$ dry etching.

FIG. 3 also illustrates the embodiment in which the air gap 310 extends for the entire depth of the through-silicon via and extends over the surface of the IMD layers 120. In this embodiment, the air gap 310 continues over the upper surface of the IMD layers 120 (or the ILD layer 116). Other surfaces, such as the contact 122, formed of materials having a high etch selectivity with the material of the liner 126 may cause the etching process to stop. The etching process may also be a timed etch to control the amount of the liner 126 to be removed.

Figure 4:
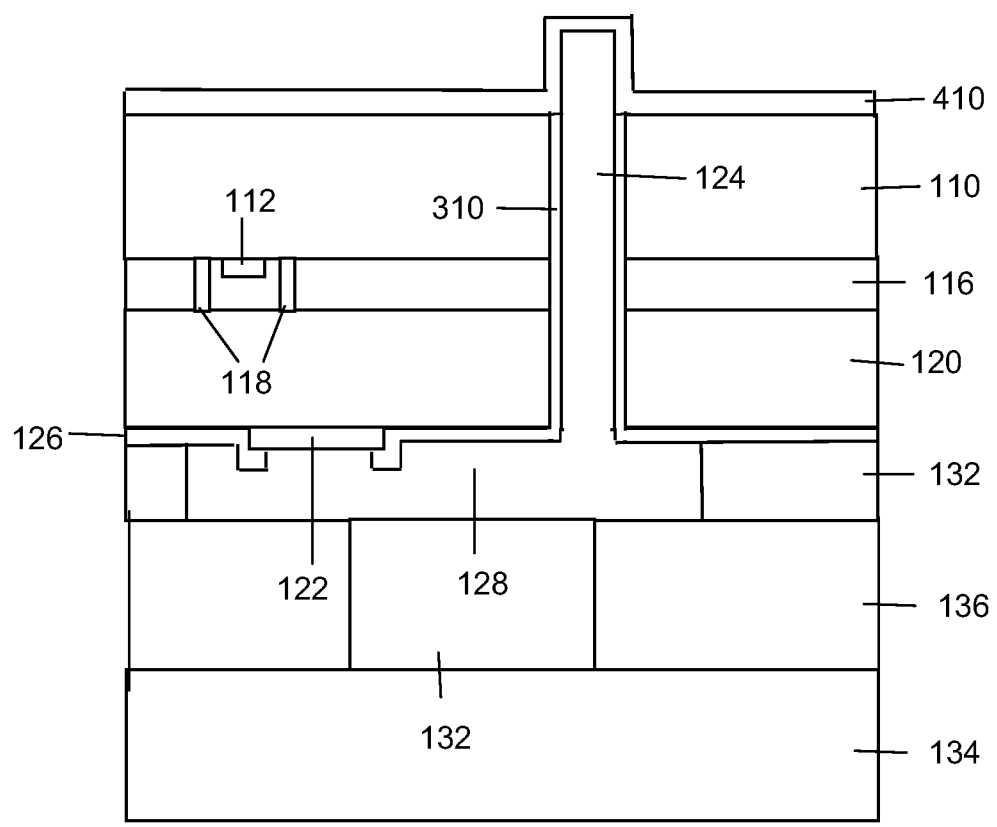

FIG. 4 illustrates an isolation film 410 formed over the backside of the semiconductor substrate 110 (or a native oxide that may be formed on the surface of the semiconductor substrate 110) in accordance with an embodiment of the present invention. In a preferred embodiment, the isolation film 410 is a dielectric material, such as SiN, an oxide, SiC, SiON, a polymer, or the like, and may be formed by, for example, spin-coating, printing, a CVD process, or the like. The isolation film 410 is preferably formed having a thickness sufficient to cover the opening of the air gap 310 alongside the conductive material of the through-silicon via 124.

It should be noted that FIG. 4 illustrates a conformal layer for illustrative purposes only, and that other processes may be used. For example, a spin-on process that creates a more planar surface may be used.

Figure 5:
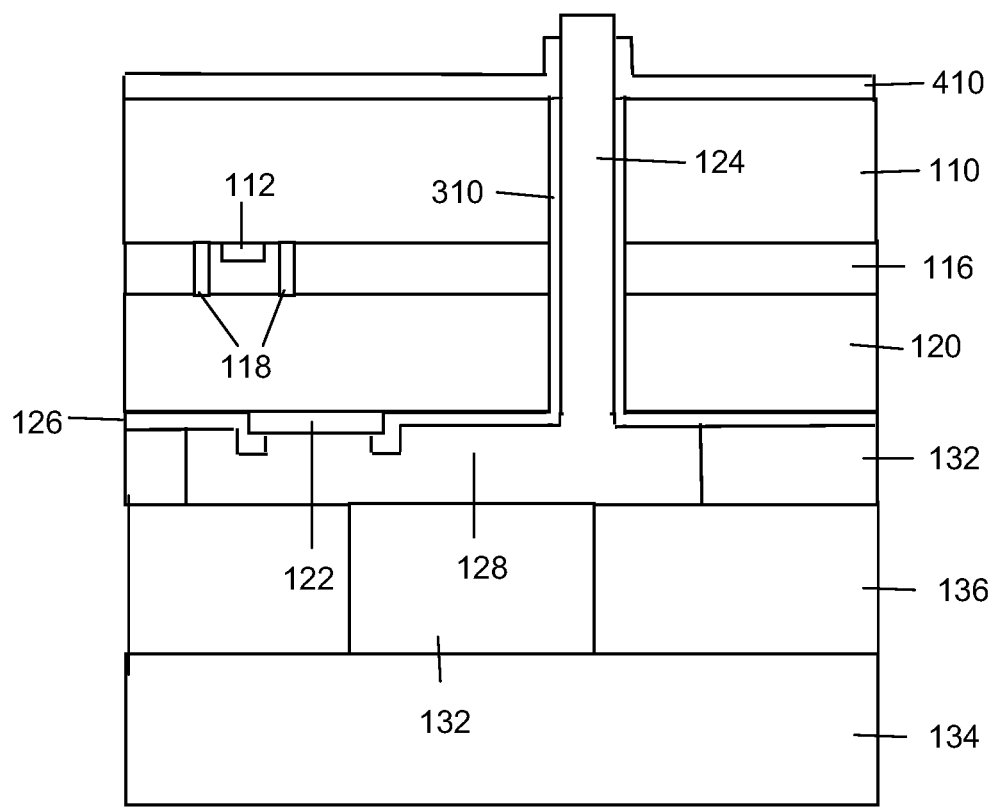

FIG. 5 illustrates exposure of the through-silicon via 124 in accordance with an embodiment of the present invention. The isolation film 410 may be removed using photolithographic techniques in which a patterned mask is formed that protects the isolation film 410 except for the portions overlying the through-silicon via 124. The exposed portions of the isolation film 410 overlying the through-silicon via 124 may then be removed using an etching process. In the embodiment illustrated in FIG. 5, the etching process is continued until the through-silicon via 124 protrudes from the isolation film 410.

Thereafter, other back-end-of-line (BEOL) processing techniques suitable for the particular application may be performed to complete the semiconductor device. For example, the carrier substrate 134 may be removed, under-bump metallization and contacts may be formed on the circuit side and the backside of the substrate, an encapsulant may be formed, a singulation process may be performed to singulate individual dies, wafer-level or die-level stacking, and the like, may be performed. It should be noted, however, that embodiments of the present invention may be used in many different situations. For example, embodiments of the present invention may be used in a die-to-die bonding configuration, a die-to-wafer bonding configuration, or a wafer-to-wafer bonding configuration.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a semiconductor substrate;
a through via extending through the semiconductor substrate;
an air gap interposed between the through via and the semiconductor substrate; and
a dielectric layer overlying a backside of the semiconductor substrate and extending at least partially over the air gap.

2. The semiconductor device of claim 1, wherein a portion of the through via protrudes from a backside of the semiconductor substrate.

3. The semiconductor device of claim 1, wherein the dielectric layer seals the air gap along the backside of the semiconductor substrate.

4. The semiconductor device of claim 3, wherein the dielectric layer extends over a portion of the through via protruding from the backside of the semiconductor substrate.

5. The semiconductor device of claim 3, wherein at least a portion of the through via protrudes from the dielectric layer.

6. The semiconductor device of claim 1, wherein the air gap extends over a dielectric layer on a circuit side of the semiconductor substrate.

7. The semiconductor device of claim 1, further comprising a conductive layer extending over a dielectric layer from the through via to a contact, wherein the conductive layer and the through via are formed of a single continuous layer of conductive material.

8. A semiconductor device comprising:
a substrate having a circuit side and a backside, the substrate having electrical circuitry formed on the circuit side;
an opening extending from the circuit side to the backside;
conductive material extending through the opening, the conductive material extending from the circuit side to the backside;
a gap between the conductive material and sidewalls of the opening; and
an isolation film overlying the backside of the substrate and abutting the conductive material such that the isolation film extends over the gap.

9. The semiconductor device of claim 8, wherein a portion of the conductive material protrudes from the backside of the substrate.

10. The semiconductor device of claim 8, wherein the isolation film seals the gap along the backside of the substrate.

11. The semiconductor device of claim 10, wherein the isolation film extends over a portion of the conductive material protruding from the backside of the substrate.

12. The semiconductor device of claim 10, wherein at least a portion of the conductive material protrudes from the isolation film.

13. The semiconductor device of claim 8, wherein the gap extends over a dielectric layer on the circuit side of the substrate.

14. The semiconductor device of claim 8, wherein the conductive material extends over a dielectric layer on the circuit side of the substrate.

15. A semiconductor device comprising:
a substrate having a first side and a second side;
a first dielectric layer over the first side of the substrate;
a conductive material extending over at least a portion of the first dielectric layer and through an opening in the substrate, wherein the conductive material is spaced apart from sidewalls of the opening; and
a second dielectric layer over the second side of the substrate, the second dielectric layer extending over the space between the substrate and the conductive material.

16. The semiconductor device of claim 15, wherein a portion of the conductive material protrudes from the second side of the substrate.

17. The semiconductor device of claim 15, wherein the conductive material protrudes from the second side of the substrate and wherein the second dielectric layer forms a seal around the conductive material.

18. The semiconductor device of claim 17, wherein at least a portion of the conductive material protrudes from the second dielectric layer.

19. The semiconductor device of claim 15, wherein the conductive material protrudes from the second side of the substrate and wherein the second dielectric layer extends up a sidewall of the conductive material.

20. The semiconductor device of claim 15, wherein at least a portion of the conductive material extending over the first dielectric layer is spaced apart from the first dielectric layer.

* * * * *